(12) United States Patent
Han et al.

(10) Patent No.: US 10,546,546 B2
(45) Date of Patent: Jan. 28, 2020

(54) PXIEL DRIVING CIRCUIT AND DRIVING METHOD THEREOF, ARRAY SUBSTRATE, DISPLAY PANEL, AND DISPLAY APPARATUS

(71) Applicant: BOE TECHNOLOGY GROUP CO., LTD., Beijing (CN)

(72) Inventors: Seungwoo Han, Beijing (CN); Guangliang Shang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 121 days.

(21) Appl. No.: 15/574,867

(22) PCT Filed: May 17, 2017

(86) PCT No.: PCT/CN2017/084705
§ 371 (c)(1),
(2) Date: Nov. 17, 2017

(87) PCT Pub. No.: WO2018/054074
PCT Pub. Date: Mar. 29, 2018

(65) Prior Publication Data
US 2019/0221178 A1     Jul. 18, 2019

(30) Foreign Application Priority Data
Sep. 26, 2016  (CN) .......................... 2016 1 0853205

(51) Int. Cl.
*G09G 3/36*     (2006.01)
*H01L 27/12*    (2006.01)

(52) U.S. Cl.
CPC ... *G09G 3/3614* (2013.01); *G09G 2300/0823* (2013.01); *G09G 2310/061* (2013.01); *H01L 27/1225* (2013.01)

(58) Field of Classification Search
CPC ......... G09G 3/3614; G09G 2300/0823; G09G 2310/061; H01L 27/1225
(Continued)

(56) References Cited

U.S. PATENT DOCUMENTS 6,498,596 B1 *  12/2002  Nakamura ........... G09G 3/2011
                                                     341/144
9,013,389 B2     4/2015  Koyama et al.
(Continued)

FOREIGN PATENT DOCUMENTS

| CN | 102782746 A | 11/2012 |
| CN | 103413520 A | 11/2013 |
| CN | 106782267 A | 5/2017 |

OTHER PUBLICATIONS

International Search Report dated Aug. 14, 2017, issued in counterpart International Application No. PCT/CN2017/084705 (5 pages).
(Continued)

*Primary Examiner* — Jennifer Mehmood
*Assistant Examiner* — Ngan T Pham Lu
(74) *Attorney, Agent, or Firm* — Westerman, Hattori, Daniels & Adrian, LLP

(57) ABSTRACT

A pixel driving circuit for a display apparatus. The pixel driving circuit may include a first gate line, a second gate line, a data line, a first thin-film transistor, and a second thin-film transistor. A gate of the first thin-film transistor may be coupled to the first gate line. A source of the first thin-film transistor may be coupled to the data line. A drain of the first thin-film transistor may be coupled to a source of the second thin-film transistor. A gate of the second thin-film transistor may be coupled to the second gate line. A drain of the second thin-film transistor may be coupled to a pixel electrode.

5 Claims, 2 Drawing Sheets

(58) Field of Classification Search
USPC .......................................................... 345/209
See application file for complete search history.

(56) References Cited

U.S. PATENT DOCUMENTS

| | | | |
|---|---|---|---|
| 9,230,479 B2 | 1/2016 | Tan et al. | |
| 2007/0228411 A1 | 10/2007 | Lee et al. | |
| 2008/0013007 A1* | 1/2008 | Yokoyama | G09G 3/3659 |
| | | | 349/39 |
| 2008/0067512 A1* | 3/2008 | Lee | G09G 3/3659 |
| | | | 257/59 |
| 2008/0291223 A1* | 11/2008 | Yamazaki | G09G 3/3614 |
| | | | 345/690 |
| 2015/0029170 A1 | 1/2015 | Shin et al. | |

OTHER PUBLICATIONS

Written Opinion of the International Seaching Authority dated Aug. 14, 2017, issued in counterpart International Application No. PCT/CN2017/084705 (5 pages).

Office Action dated Nov. 22, 2019, issued in counterpart CN application No. 201610853205.3, with English translation. (14 pages).

* cited by examiner

US 10,546,546 B2

PXIEL DRIVING CIRCUIT AND DRIVING METHOD THEREOF, ARRAY SUBSTRATE, DISPLAY PANEL, AND DISPLAY APPARATUS

CROSS-REFERENCE TO RELATED APPLICATIONS

This application claims the benefit of the filing date of Chinese Patent Application No. 201610853205.3 filed on Sep. 26, 2016, the disclosure of which is hereby incorporated by reference.

TECHNICAL FIELD

This invention relates to a display technology, and more particularly, to a pixel driving circuit and a driving method thereof, an array substrate, a display panel, and a display apparatus.

BACKGROUND

An array substrate of a display apparatus typically includes a plurality of pixel circuits. Each of the pixel circuits includes a pixel electrode and a pixel driving circuit provided in correspondence with the pixel electrode. When a suitable voltage is applied to the pixel electrode through the corresponding pixel driving circuit, the pixel circuit exhibits a normal display.

BRIEF SUMMARY

Accordingly one example of the present disclosure is a pixel driving circuit. The pixel driving circuit may comprise a first gate line, a second gate line, a data line, a first thin-film transistor, and a second thin-film transistor. A gate of the first thin-film transistor may be coupled to the first gate line. A source of the first thin-film transistor may be coupled to the data line. A drain of the first thin-film transistor may be coupled to a source of the second thin-film transistor. A gate of the second thin-film transistor may be coupled to the second gate line. A drain of the second thin-film transistor may be coupled to a pixel electrode. Both the first thin-film transistor and the second thin-film transistor may be oxide thin-film transistors.

Another example of the present disclosure is an array substrate comprising a plurality of pixel units arranged in a matrix. Each of the pixel units may comprise the pixel driving circuit according to one embodiment of the disclosure, a pixel electrode, and a common electrode line. The pixel electrode and a corresponding portion of the common electrode line may form a storage capacitor of the pixel driving circuit. The pixel electrode may be coupled to the drain of the second thin-film transistor of the pixel driving circuit and the common electrode line may be used for transmitting a common voltage. Pixel driving circuits of the pixel units of the same row may share the first gate line, the second gate line and the common electrode line. Pixel driving circuits of the pixel units of the same column may share the data line.

Another example of the present disclosure is a display panel. The display panel may comprise the array substrate according to one embodiment of the present disclosure.

Another example of the present disclosure is a display apparatus. The display apparatus may comprise the display panel according to one embodiment of the disclosure.

Another example of the present disclosure is a driving method of the pixel driving circuit according to one embodiment of the present disclosure. The driving method may comprise a first scanning period and a second scanning period. In the first scanning period, a first voltage may be constantly applied to the gate of the first thin-film transistor through the first gate line, a first voltage pulse having a pulse width may be applied to the gate of the second thin-film transistor through the second gate line, and a second voltage may be constantly applied to the gate of the second thin-film transistor through the second gate line during a time outside the pulse width. In the second scanning period, the first voltage may be constantly applied to the gate of the second thin-film transistor through the second gate line, and the first voltage pulse having the pulse width may be applied to the gate of the first thin-film transistor through the first gate line, and the second voltage may be constantly applied to the gate of the first thin-film transistor through the first gate line during a time outside the pulse width. Polarity of the first voltage may be opposite to polarity of the second voltage.

The driving method may further comprise a blank period between the first scanning period and the adjacent second scanning period. In the blank period, a second voltage may be applied to the gate of the first thin-film transistor through the first gate line, and a second voltage may be applied to the gate of the second thin-film transistor through the second gate line so that the first thin-film transistor and the second thin-film transistor may be turned off at the same time. Duration of the blank period may be within a range of 0.1 μs to 10000 μs. The first scanning period and the second scanning period may appear alternatively. Both the first thin-film transistor and the second thin-film transistor may be oxide N-type thin-film transistors. The first voltage may be a positive bias voltage, and the second voltage may be a negative bias voltage.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
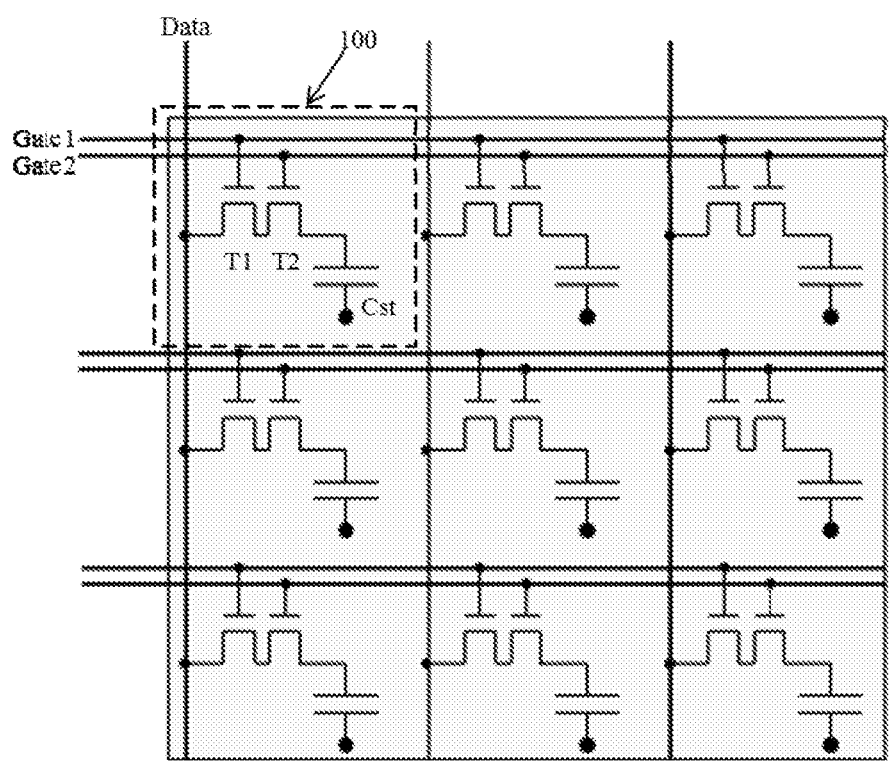
FIG. 1 is a schematic structural view of a pixel driving circuit according to one embodiment.

The present invention is described with reference to embodiments of the invention. Throughout the description of the invention reference is made to FIGS. 1-3. When referring to the figures, like structures and elements shown throughout are indicated with like reference numerals. The described embodiments are merely part of the present invention, and not all embodiments. All other embodiments obtained by those skilled in the art without departing from the inventive work are within the scope of the present invention.

The following terms, used in the present description and the appended claims, have the following definition.

The term "polarity of the first voltage" refers to positive or negative characteristic of a voltage difference of the first voltage with respect to a reference voltage. "Polarity of the second voltage" refers to positive or negative characteristic of a voltage difference of the second voltage with respect to a reference voltage. The reference voltages of the first voltage and the second voltage may be the same voltage, and a value of the reference voltage may be zero or other value.

A pixel driving circuit typically includes a gate line, a data line, a thin-film transistor (TFT), and a storage capacitor. For an N-type thin-film transistor, in a frame time, a positive bias voltage pulse is first applied to a gate of the thin-film transistor through the gate line. As such, the thin-film transistor is turned on and the storage capacitor is charged so that the pixel circuit displays a frame of picture. Then, a negative bias voltage is applied to the gate of the thin-film transistor through the gate line. As such, the thin-film transistor is turned off and the storage capacitor is discharged so that the pixel circuit maintains the displayed picture.

During the above-described driving process, the gate of the thin-film transistor is mostly at a negative bias voltage. For an oxide thin-film transistor (oxide TFT), being in the negative bias voltage over a long time decreases oxygen vacancies and increases metal ions in an active layer of a semiconductor. This in turn results in excessive negative shifting of a threshold voltage (Vth) of the oxide thin-film transistor. As a result, normal voltage of pixel circuits cannot be maintained, and accordingly abnormal phenomena such as over bright pixels or over dark pixels are displayed.

FIG. 1 shows a schematic structural view of a pixel driving circuit according to one embodiment of the present disclosure. As shown in FIG. 1, the pixel driving circuit 100 includes a first gate line Gate1, a second gate line Gate2, a data line Data, a first thin-film transistor T1, a second thin-film transistor T2, and a storage capacitor Cst. A gate of the first thin-film transistor T1 is coupled to the first gate line Gate1. A source of the first thin-film transistor T1 is coupled to the data line Data. A drain of the first thin-film transistor T1 is coupled to a source of the second thin-film transistor T2. A gate of the second thin-film transistor T2 is coupled to the second gate line Gate2. A first electrode plate of the storage capacitor Cst is coupled to a drain of the second thin-film transistor T2. A second electrode of the storage capacitor Cst is coupled to a common voltage.

In one embodiment, the "storage capacitor Cst" is actually formed by a pixel electrode of an array substrate and a corresponding portion of common electrode line. That is, the portion of the pixel electrode corresponding to the common electrode line is considered as the first electrode plate of the storage capacitor Cst. The portion of the common electrode line corresponding to the pixel electrode is considered as the second electrode plate of the storage capacitor Cst. Thus, the above-mentioned "a first electrode plate of the storage capacitor Cst is coupled to a drain of the second thin-film transistor T2" actually means that the pixel electrode is coupled to the drain of the second thin-film transistor T2. That "a second electrode of the storage capacitor Cst is coupled to a common voltage" actually means that the common electrode line is coupled to the common voltage. In another embodiment, the storage capacitor is formed between a pixel electrode and a corresponding portion of common electrode connected to the common electrode line.

Figure 2:
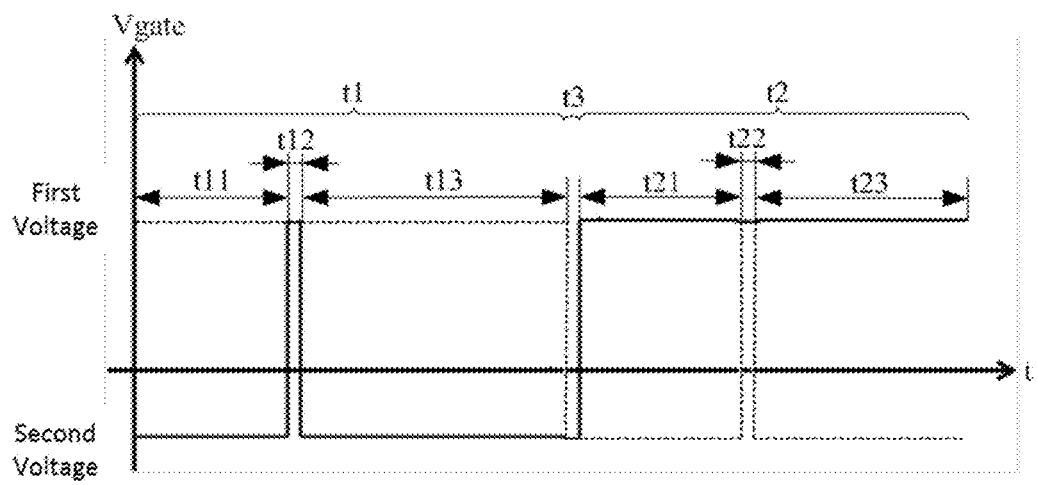
FIG. 2 is a timing chart of a driving method of a pixel driving circuit according to one embodiment.

FIG. 2 shows a timing chart of a driving method of a pixel driving circuit according to one embodiment of the present disclosure. The dotted line in FIG. 2 shows change of Vgate1 on the first gate line Gate1, and the solid line shows change of Vgate2 on the second gate line Gate2. As shown in FIG. 2, the driving method of the pixel driving circuit includes a plurality of scanning periods, wherein one of two adjacent scanning periods is referred as a first scanning period t1 and the other is referred as a second scanning period t2, and the first scanning period t1 and the second scanning period t2 appear alternately. The driving method includes the following:

In the first scanning period t1, a first voltage is constantly applied to the gate of the first thin-film transistor T1 through the first gate line Gate1 to turn on the first thin-film transistor T1. Furthermore, a first voltage pulse having a pulse width is applied to the gate of the second thin-film transistor T2 through the second gate line Gate2. At a time outside the pulse width, a second voltage is applied to the gate of the second thin-film transistor T2 through the second gate line Gate2. As such, the second thin-film transistor T2 is turned on within the pulse width, and is turned off at the time outside the pulse width.

In the second scanning period t2, the first voltage is constantly applied to the gate of the second thin-film transistor T2 through the second gate line Gate2 to turn on the second thin-film transistor T2. Furthermore, the first voltage pulse is applied to the gate of the first thin-film transistor T1 through the first gate line Gate1. At a time outside the pulse width, the second voltage is applied to the gate of the first thin-film transistor T1 through the first gate line Gate1. As such, the first thin-film transistor T1 is turned on within the pulse width, and is turned off at the time outside the pulse width. Polarity of the first voltage is opposite to polarity of the second voltage.

Figure 3:
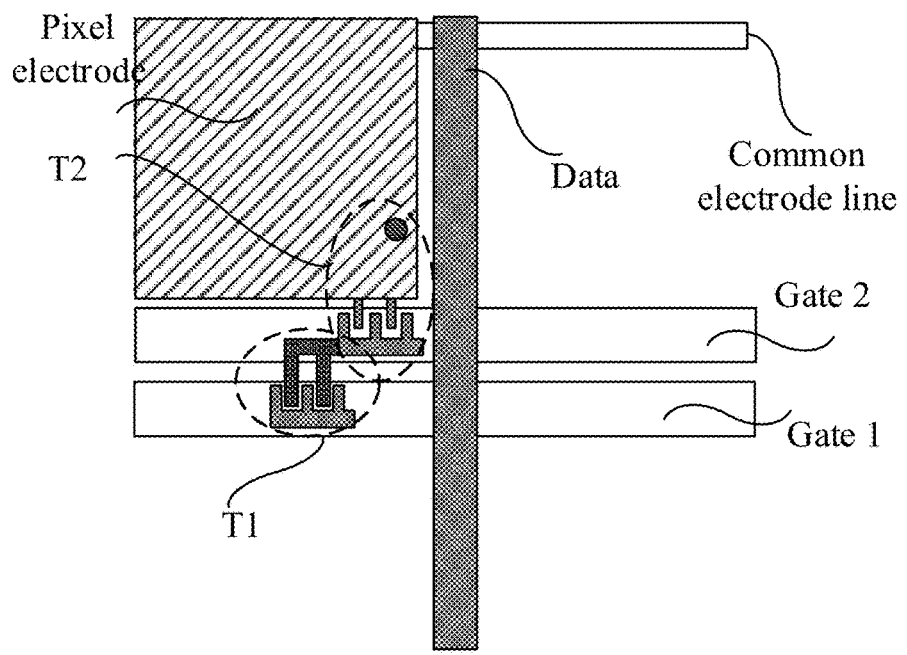
FIG. 3 is a schematic structural view of a pixel unit according to one embodiment.

FIG. 3 shows a schematic structural view of a pixel unit according to one embodiment. As shown in FIG. 3, a storage capacitor is formed between a pixel electrode and a corresponding portion of the common electrode line.

In one embodiment, in combination with the structure and the driving method of the pixel driving circuit 100, as shown in FIGS. 1-3, a process of driving screen display of the pixel driving circuit 100 is as follows:

The first scanning period t1 includes three periods, which are t11, t12 and t13 respectively. In the period of t11 to t13, which is the entire t1 period, the gate of the first thin-film transistor T1 is constantly applied with the first voltage so that the first thin-film transistor T1 remains turned on. During this process, in the t11 period, the gate of the second thin-film transistor T2 is applied with the second voltage so that the second thin-film transistor T2 is turned off. As a result, data voltage signals on the data line Data cannot be transmitted through the second thin-film transistor T2. In the t12 period, the gate of the second thin-film transistor T2 is applied with the first voltage so that the second thin-film transistor T2 is turned on. As a result, the data voltage signals on the data line Data are transmitted to the storage capacitor Cst through the second thin-film transistor T2. Accordingly, the storage capacitor Cst is charged and a frame of screen image is displayed. Since a time required for charging the storage capacitor Cst is relatively short, duration of the t12 period is relatively short. As such, the first voltage applied to the gate of the second thin-film transistor T2 in the t12 period may be a pulse voltage. In the t13 period, the gate of the second thin-film transistor T2 is reapplied with the second voltage so that the second thin-film transistor T2 is turned off again. As a result, the data voltage signals on the data line Data cannot be transmitted through the second thin-film transistor T2. Accordingly, the storage capacitor Cst discharges to maintain the display of the frame of screen image.

As described above in the first scanning period t1, the gate of the first thin-film transistor T1 is constantly at the first voltage. Accordingly, a threshold voltage of the first thin-film transistor T1 is shifted in a direction of polarity of the first voltage. Since the gate of the second thin-film transistor T2 is at the second voltage for a relatively long time, a threshold voltage of the second thin-film transistor T2 is shifted in a direction of polarity of the second voltage.

The second scanning period t2 also includes three periods, which are t21, t22, and t23 respectively. In the period of t21 to t23, which is the entire t2 period, the gate of the second thin-film transistor T2 is constantly applied with the first (voltage so that the second thin-film transistor T2 remains turned on. During this process, in the t21 period, the gate of the first thin-film transistor T1 is applied with a second voltage so that the first thin-film transistor T1 is turned off. As a result, data voltage signals on the data line Data cannot be transmitted through the first thin-film transistor T1. In the t22 period, the gate of the first thin-film transistor T1 is applied with the first voltage so that the first thin-film transistor T1 is turned on. As a result, the data voltage signals on the data line Data are transmitted to the storage capacitor Cst through the first thin-film transistor T1. Accordingly, the capacitor Cst is charged, and a next frame of screen image is displayed. Since a time required for charging the storage capacitor Cst is relatively short, duration of the t22 period is relatively short. As such, the first voltage applied to the gate of the first thin-film transistor T1 in the t22 period may be a pulse voltage. In the t23 period, the gate of the first thin-film transistor T1 is reapplied with the second voltage so that the first thin-film transistor T1 is turned off again. As a result, the data voltage signals on the data line Data cannot be transmitted through the first thin-film transistor T1. Accordingly, the storage capacitor Cst discharges to maintain the display of the next frame of the screen image.

As discussed above in the second scanning period t2, the gate of the second thin-film transistor T2 is constantly at the first voltage. Accordingly, the threshold voltage of the second thin-film transistor T2 is shifted in a direction of polarity of the first voltage. Since the gate of the first thin-film transistor T1 is at the second voltage for a relatively long time, the threshold voltage of the first thin-film transistor T1 is shifted in a direction of polarity of the second voltage.

Therefore, in the pixel driving circuit 100 and the driving method thereof according to one embodiment of the present disclosure, by arranging two gate lines Gate1 and Gate2 and two thin-film transistors T1 and T2, the two thin-film transistors T1 and T2 are driven alternatively in two adjacent scanning periods. As such, the first thin-film transistor T1 is alternately subjected to the first voltage and the second voltage having opposite polarities, and the second thin-film transistor T2 is alternately subjected to the first voltage and the second voltage having opposite polarities. As a result, the threshold voltage of the first thin-film transistor T1 is shifted alternatively in the direction of the polarity of the first voltage and the direction of the polarity of the second voltage. That is, the threshold voltage of the first thin-film transistor T1 is shifted alternatively in a positive direction and a negative direction. Similarly, the threshold voltage of the second thin-film transistor T2 is also shifted in the directions of positive polarity and negative polarity alternatively. Therefore, compensation of the shifting of the threshold voltages of the first thin-film transistor T1 and the second thin-film transistor T2 during the driving process is realized, and the threshold voltages of the thin-film transistors are prevented from excessively shifting to a direction of a polarity of a voltage (i.e., positive or negative), thereby reducing abnormal display phenomena and improving display quality.

The polarity characteristics of the first voltage and the second voltage are specifically determined by the types of the first thin-film transistor T1 and the second thin-film transistor T2 in the pixel driving circuit. When both the first thin-film transistor T1 and the second thin-film transistor T2 are N-type thin-film transistors, the first thin-film transistor T1 and the second thin-film transistor T2 have a characteristic of being turned on at a positive bias voltage and turned off at a negative bias voltage. Thus, the polarity of the first voltage is positive and the polarity of the second voltage is negative. That is, the first voltage is a positive bias voltage and the second voltage is a negative bias voltage. When both the first thin-film transistor T1 and the second thin-film transistor T2 are P-type thin-film transistors, the first thin-film transistor T1 and the second thin-film transistor T2 have a characteristic of being turned on at a negative bias voltage and turned off at a positive bias voltage. Thus, the polarity of the first voltage is negative, and the polarity of the second voltage is positive. That is, the first voltage is a negative bias voltage, and the second voltage is a positive bias voltage.

In addition, when an N-type oxide thin-film transistor is subjected to a negative bias voltage for a long time, excessive shifting of the threshold voltage in a direction of the negative voltage is particularly serious. Therefore, the technical solution provided by the present embodiment is suitable for improving performance of an array substrate comprising oxide thin-film transistors. That is, in one embodiment, the first thin-film transistor T1 and the second thin-film transistor T2 in the pixel driving circuit 100 are both oxide thin-film transistors. In another embodiment, the first thin-film transistor T1 and the second thin-film transistor T2 in the pixel driving circuit 100 are both N type oxide thin-film transistors.

In one embodiment, as shown in FIG. 2, the driving method of the pixel driving circuit comprises a blank period t3 between the adjacent two scanning periods t1 and t2. In the blank period t3, a second voltage is applied to the gate of the first thin-film transistor T1 through the first gate line Gate1, and a second voltage is applied to the gate of the second thin-film transistor T2 through the second gate line Gate2. Thus, both the first thin-film transistor T1 and the second thin-film transistor T2 are off at the same time. As such, it is guaranteed that the first thin-film transistor T1 and the second thin-film transistor T2 are not turned on at the same time, thereby ensuring normal display of screen images.

In one embodiment, both the first thin-film transistor T1 and the second thin-film transistor T2 are N-type thin-film transistors. The first voltage is a positive bias voltage and the second voltage is a negative bias voltage. In the blank period t3, a negative bias voltage (that is, the second voltage) is applied to the gate of the first thin-film transistor T1 through the first gate line Gate1, and a negative bias voltage is applied to the gate of the second membrane transistor T2 through the second gate line Gate2. As a result, during the process of the gate voltage Vgate1 of the first thin-film transistor T1 switching between the positive and the negative voltages and the gate voltage Vgate2 of the second thin-film transistor T2 switching between the negative and the positive voltages, the gate voltages of the first thin-film transistor T1 and the second thin-film transistor T2 would not be positive bias voltages at the same time. Correspondingly, the two thin-film transistors would not be on at the same time, thereby ensuring normal display of screen images.

In one embodiment, duration of the blank period t3 is within a range of 0.1 μs to 10000 μs. In another embodiment, duration of the blank period t3 is within a range of 1 μs to 8000 μs.

Another example of the present disclosure is an array substrate including a plurality of pixel circuits arranged in a matrix. As shown in FIG. 1, each of the pixel circuits includes a pixel driving circuit 100 according to one embodiment of the present disclosure, a pixel electrode and a common electrode line. In one embodiment, the pixel electrode and the corresponding portion of the common electrode line form a storage capacitor Cst of the pixel driving circuit 100. The pixel electrode is coupled to the drain of the second thin-film transistor T2 of the pixel driving circuit 100, and the common electrode line is used for transmitting the common voltage.

Since the threshold voltages of the thin-film transistors in the pixel driving circuit 100 according to one embodiment of the present disclosure do not have a problem of excessive positive or negative shifting, the array substrate including the pixel driving circuit 100 does not have display abnormality caused by the excessive positive or negative shifting of the threshold voltages. As such, a high quality of display is obtained.

In one embodiment, as shown in FIG. 1, in the array substrate, pixel driving circuits 100 of pixel circuits of the same row share the first gate line Gate1, the second gate line Gate2, and the common electrode line. Pixel driving circuits 100 of pixel circuits of the same column share the data line Data.

Another example of the present disclosure is a display panel including the array substrate according to one embodiment of the present disclosure. Since the array substrate eliminates the display abnormality caused by the excessive positive or negative shifting of the threshold voltages, the display quality of the display panel including the array substrate is high.

Another example of the present disclosure is a display apparatus including the display panel according to one embodiment of the present disclosure. The display apparatus does not exhibit display abnormality caused by the excessive positive or negative shifting of the threshold voltage. As such, the display quality is high.

The display apparatus may be a liquid crystal panel, an electronic paper, an OLED (Organic Light Emitting Diode) panel, a mobile phone, a tablet computer, a television, a monitor, a notebook computer, digital photo frame, navigator, or any other products or components having display function.

It will be apparent to those skilled in the art that various changes and modifications can be made in the present invention without departing from the spirit and scope of the present invention. Thus, it is intended that the present invention encompasses such modifications and variations if they come within the scope of the appended claims or the equivalents thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A driving method of a pixel driving circuit, the driving method comprising a first scanning period and a second scanning period,
wherein the pixel driving circuit comprising:
a first gate line,
a second gate line,
a data line,
a first thin-film transistor, and
a second thin-film transistor,
a gate of the first thin-film transistor is coupled to the first gate line, a source of the first thin-film transistor is coupled to the data line, a drain of the first thin-film transistor is coupled to a source of the second thin-film transistor, a gate of the second thin-film transistor is coupled to the second gate line, and
a drain of the second thin-film transistor is coupled to a pixel electrode,
wherein, in the first scanning period, a first voltage is constantly applied to the gate of the first thin-film transistor through the first gate line, and a first voltage pulse having a pulse width is applied to the gate of the second thin-film transistor through the second gate line, and a second voltage is constantly applied to the gate of the second thin-film transistor through the second gate line during a time outside the pulse width; and
in the second scanning period, the first voltage is constantly applied to the gate of the second thin-film transistor through the second gate line, and the first voltage pulse having the pulse width is applied to the gate of the first thin-film transistor through the first gate line, and the second voltage is constantly applied to the gate of the first thin-film transistor through the first gate line during a time outside the pulse width;
wherein polarity of the first voltage are opposite to polarity of the second voltage.

2. The driving method of the pixel driving circuit according to claim 1, the driving method further comprising a blank period between the first scanning period and the adjacent second scanning period,
wherein, in the blank period, a second voltage is applied to the gate of the first thin-film transistor through the first gate line, and a second voltage is applied to the gate of the second thin-film transistor through the second gate line so that the first thin-film transistor and the second thin-film transistor are turned off at the same time.

3. The driving method of the pixel driving circuit according to claim 2, wherein duration of the blank period is within a range of 0.1 μs to 10000 μs.

4. The driving method of the pixel driving circuit according to claim 2, wherein the first scanning period and the second scanning period appear alternatively.

5. The driving method of the pixel driving circuit according to claim 1, wherein both the first thin-film transistor and the second thin-film transistor are oxide N-type thin-film transistors, the first voltage is a positive bias voltage, and the second voltage is a negative bias voltage.

* * * * *